United States Patent
Moyal et al.

(10) Patent No.: US 6,472,915 B1
(45) Date of Patent: Oct. 29, 2002

(54) METHOD FOR CHARGE PUMP TRI-STATE AND POWER DOWN/UP SEQUENCE WITHOUT DISTURBING THE OUTPUT FILTER

(75) Inventors: Nathan Y. Moyal, Austin; Steven Meyers, Round Rock, both of TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/955,865

(22) Filed: Sep. 19, 2001

(51) Int. Cl.[7] .................................................. H03L 7/06
(52) U.S. Cl. ............................................................ 327/157
(58) Field of Search ................................ 327/185, 147, 327/148, 150, 156, 157, 159; 375/374, 376; 326/56–58

(56) References Cited

U.S. PATENT DOCUMENTS

| | | | | |
|---|---|---|---|---|
| 5,703,511 A | * | 12/1997 | Okamoto | 327/148 |
| 5,949,264 A | * | 9/1999 | Lo | 327/148 |
| 6,043,695 A | * | 3/2000 | O'Sullivan | 327/156 |
| 6,067,336 A | * | 5/2000 | Peng | 327/148 |
| 6,097,161 A | * | 8/2000 | Takano et al. | 307/110 |
| 6,242,956 B1 | * | 6/2001 | McCollough et al. | 327/154 |

* cited by examiner

*Primary Examiner*—My-Trang Nuton
(74) *Attorney, Agent, or Firm*—Christopher P. Maiorana, P.C.

(57) ABSTRACT

An apparatus comprising a phase lock loop (PLL) and a charge pump. The PLL may be configured to generate an output signal in response to an input signal. The charge pump may be configured within the PLL and be configured to (i) pump-up the input signal, (ii) pump-down the input signal or (iii) enter tri-state in response to a control signal.

18 Claims, 5 Drawing Sheets

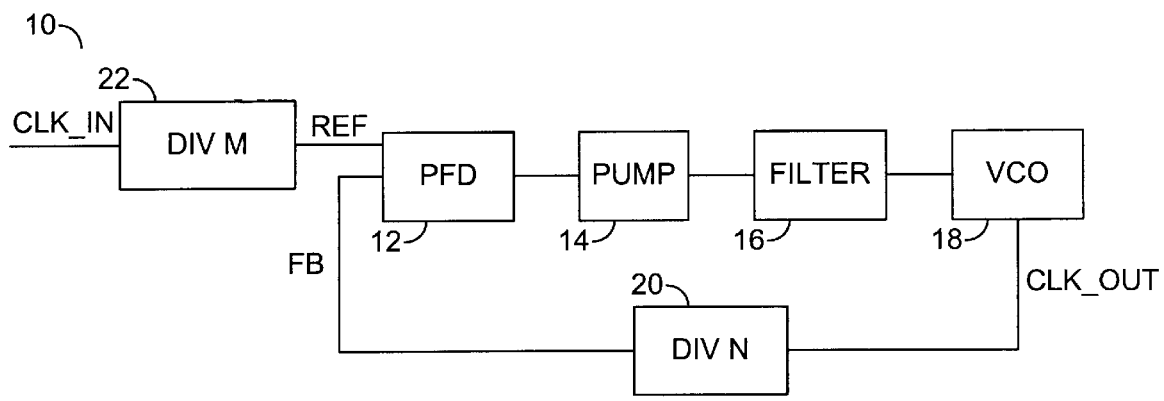
(CONVENTIONAL)
FIG. 1
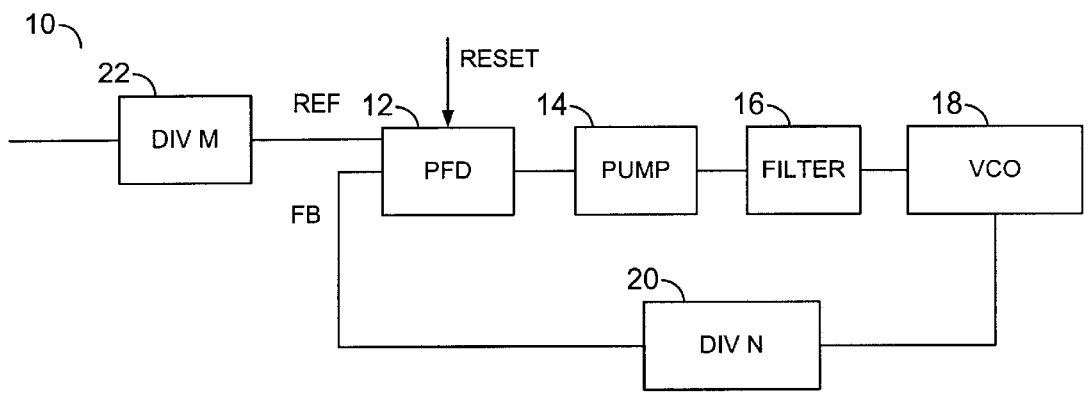
(CONVENTIONAL)
FIG. 3
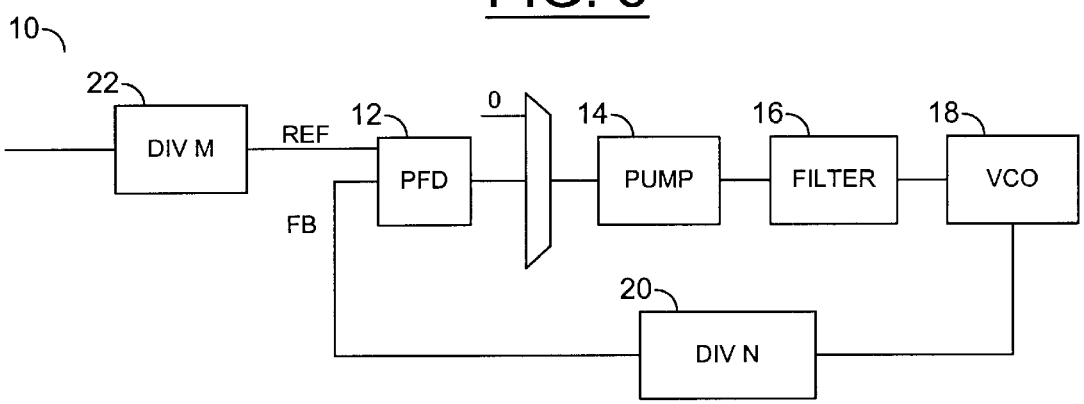
(CONVENTIONAL)
FIG. 4

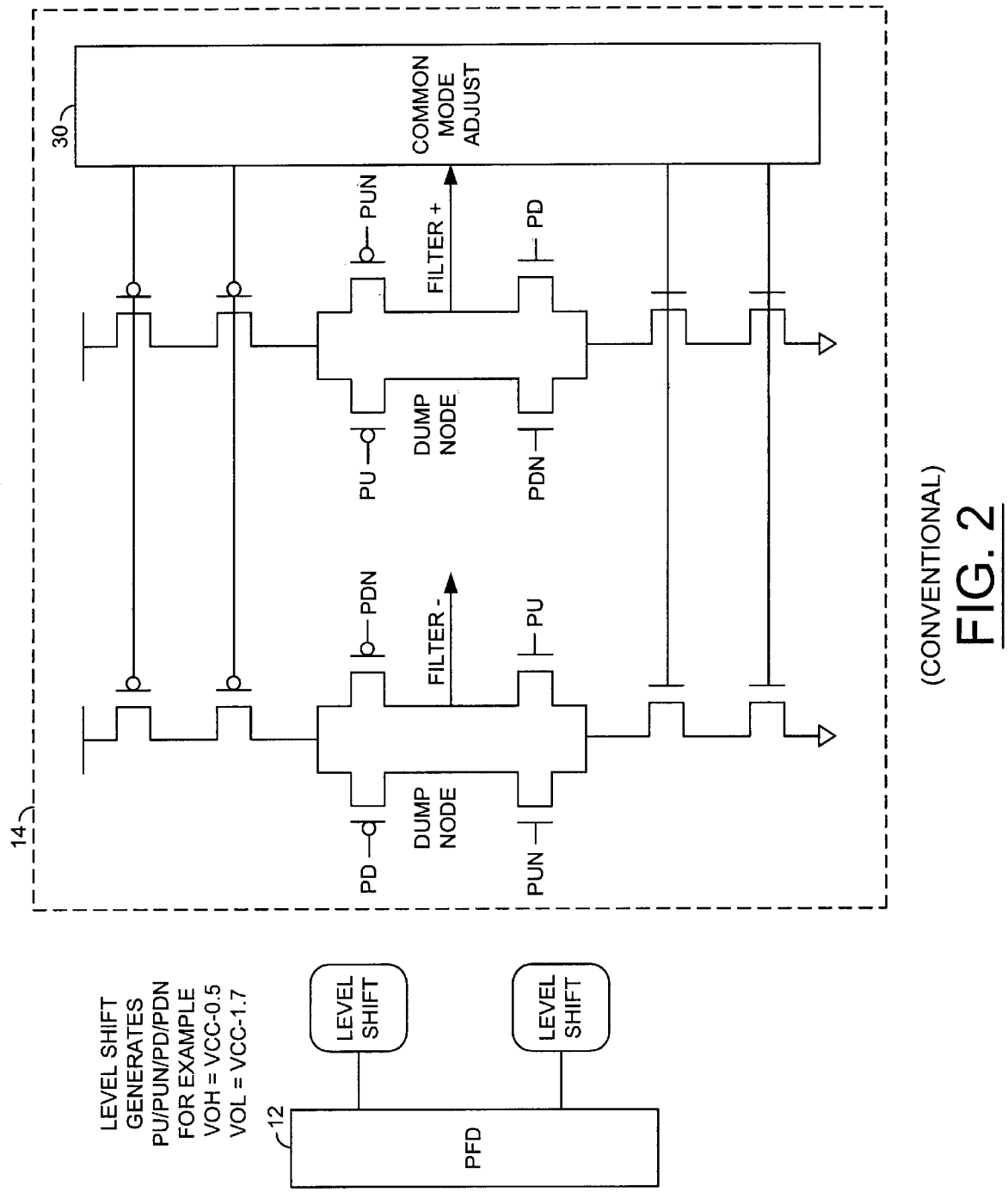
FIG. 2 (CONVENTIONAL)

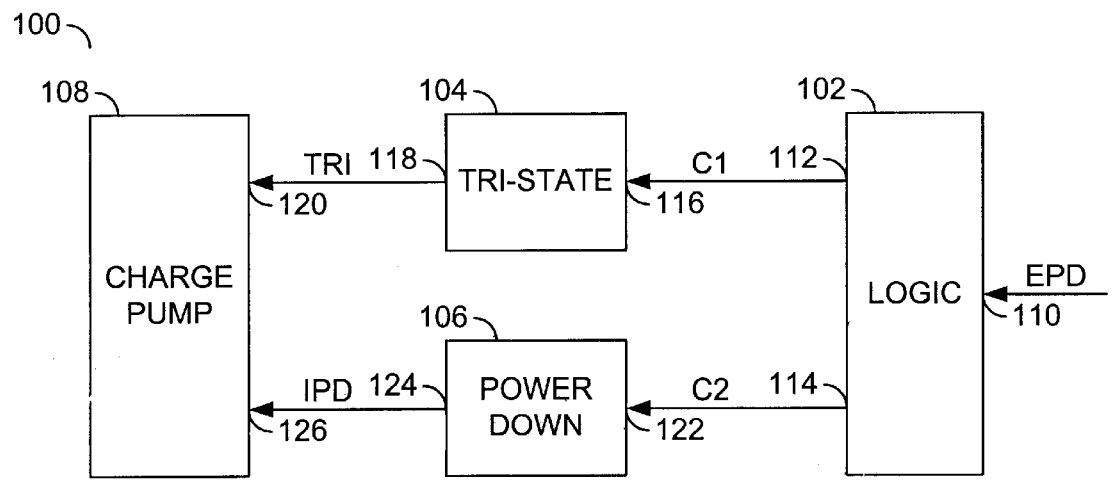
FIG. 5
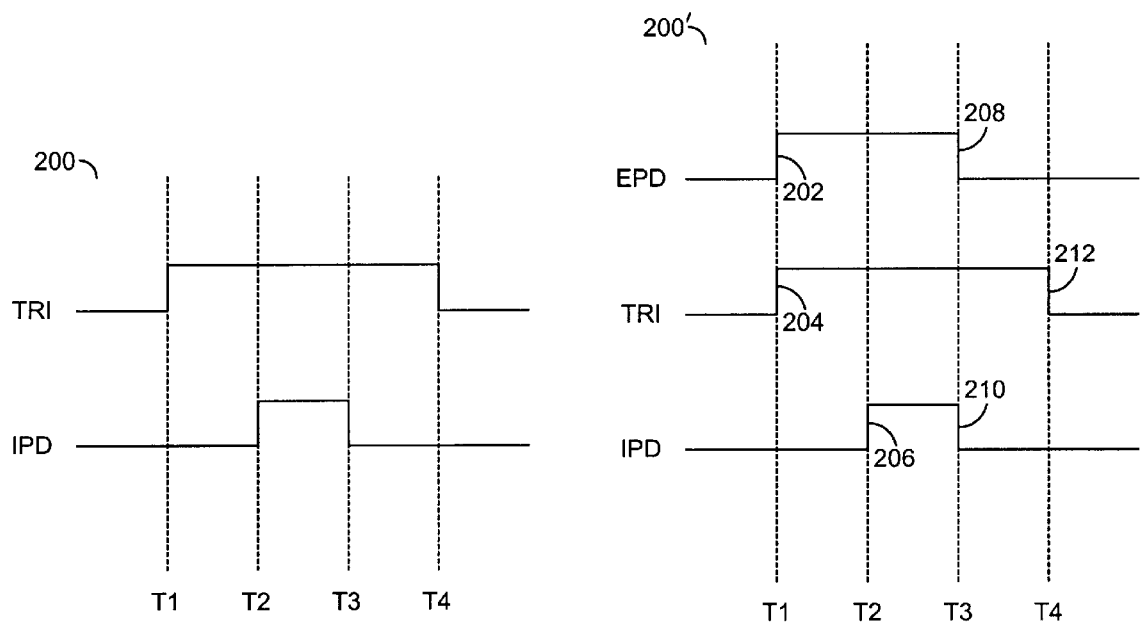
FIG. 6a
FIG. 6b

METHOD FOR CHARGE PUMP TRI-STATE AND POWER DOWN/UP SEQUENCE WITHOUT DISTURBING THE OUTPUT FILTER

FIELD OF THE INVENTION

The present invention relates to a method and/or architecture for implementing phase lock loops (PLLs) generally and, more particularly, to a method and/or architecture for implementing PLL charge pump circuits.

BACKGROUND OF THE INVENTION

PLLs are often considered to be clock multipliers. For example, an input clock of 10 Mhz can be multiplied by a PLL to yield an output frequency of 1000 Mhz. Ideally, the clock multiplication would result in an output clock that is in perfect phase alignment with the input clock.

Referring to FIG. 1, a conventional PLL architecture 10 is shown. The PLL 10 includes a phase frequency detector (PFD) 12, a charge pump 14, a filter 16, a voltage controlled oscillator (VCO) 18, and a divider 20. The PFD 12 sends the charge pump 14 information about the frequency and phase of the reference signal REF relative to the feedback clock FB. The charge pump 14 pumps up or down the frequency and presents a signal to the filter 16. The filter 16 integrates the filter information into a voltage. The VCO 18 converts the voltage information into the frequency CLK_OUT. The divider 20 divides down the higher speed frequency for a comparison by the PFD 12. A divider 22 divides the input frequency CLK_IN before being presented to the PFD 12 as the reference frequency REF.

Referring to FIG. 2, a detailed block diagram of the pump 14 is shown. The signals PD, PDN, PUN and PU control a number of switches to generate the negative filter input signal FILTER−. The signals PD, PDN, PUN and PU also control generation of the positive filter input signal FILTER+. Generation of the signals FILTER− and FILTER+ is controlled by the common mode adjust circuit 30.

RF radio receivers lock to new frequency channels (i.e., frequency hopping). Between locks, the PLL 10 is powered down. Once the PLL 10 is re-activated, the PLL circuit 10 can generate faulty pump signals. The PLL 10 can head in the wrong direction by mistakenly charging the input filter nodes FILTER− and FILTER+. The configuration of the pump element 14 is important, since the lock time specification is short. By tri-stating the pump 14 prior to powering down processing invalid signals can be avoided. A similar sequence is used when powering up.

Referring to FIG. 3, the PFD 12 can be reset internally via the reset signal RESET. However, the PFD 12 is reset too early in the feedback path. Therefore, the charge pump 14 can arrive in a wrong state while biasing down (or up). While in the wrong state, the pump 14 could wrongly charge up (or down) the input filter nodes FILTER− or FILTER+ presented to the filter 16.

Referring to FIG. 4, a multiplexer 24 can be added to the circuit 10. Alternatively, the multiplexer 24 could be replaced by a number of gates. The multiplexer (or gates) 24 is included to disable the output of the PFD 12 presented to the pump 14. The multiplexer 24 is also implemented too early in the feedback path. The charge pump 14 can still can arrive in a wrong state while biasing down (or up). While in the wrong state, the pump 14 could wrongly charge up (or down) the input filter nodes FILTER− or FILTER+. Additionally, the multiplexer 24 adds load and uses extra current.

Another conventional approach is to power down the pump 14 until the PLL 10 is functional. However, the pump 14 can still arrive in the wrong state while biasing down (or up). During the wrong state, the pump 14 could wrongly charge up (or down) the input filter nodes FILTER− or FILTER+.

It is generally desirable to provide a method and/or architecture for implementing PLL charge pump circuits that allows the PLL signal to be gated as close as possible to the output.

SUMMARY OF THE INVENTION

The present invention concerns an apparatus comprising a phase lock loop (PLL) and a charge pump. The PLL may be configured to generate an output signal in response to an input signal. The charge pump may be configured within the PLL and be configured to (i) pump-up the input signal, (ii) pump-down the input signal or (iii) enter tri-state in response to a control signal.

The objects, features and advantages of the present invention include providing a method and/or architecture for implementing PLL charge pump circuits that may (i) implement local transistors for current steering at a source of the main differential pair of a charge pump, (ii) implement local transistors for current steering at a source of the biasing transistors of a charge pump, (iii) implement local transistors operating at full CMOS levels to tri-state (or activate) a charge pump, (iv) allow current steering into the unused node (e.g., dump node) allowing drain to source voltage matching, (v) implement transistors for tri-stating that may be used as spare transistors in normal operation, (vi) allow a sequence of power down events, (vii) enable tri-stating prior to pump power down, (viii) allow a sequence of power up events, (ix) enable tri-stating prior to power up, and/or (x) provide a differential charge pump with tri-state capabilities implemented with minimum number of transistors (e.g., only 4 transistor may be used to tri-state).

BRIEF DESCRIPTION OF THE DRAWINGS

These and other objects, features and advantages of the present invention will be apparent from the following detailed description and the appended claims and drawings in which:

FIG. 1 is a block diagram of a typical PLL is shown;

FIG. 2 is a block diagram of a typical differential charge pump is shown

FIG. 3 is a block diagram of a typical reset PLL circuit;

FIG. 4 is a block diagram of a typical multiplexed PLL circuit;

FIG. 5 is a block diagram of a preferred embodiment of the present invention;

FIGS. 6a and 6b are timing diagrams illustrating operations of the present invention;

DETAILED DESCRIPTION OF THE PREFERRED EMBODIMENTS

Figure 7:
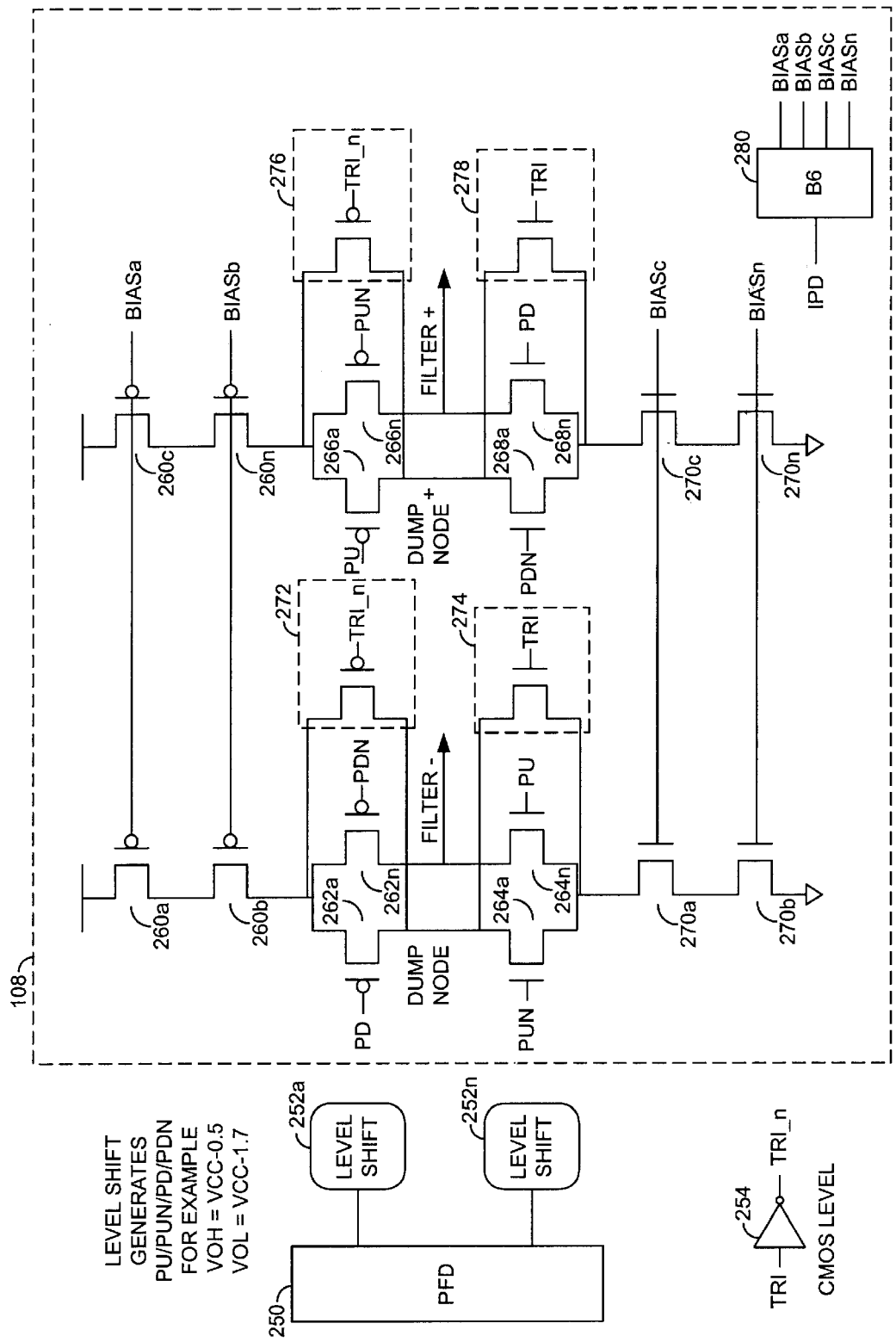
FIG. 7 is a schematic of a preferred embodiment of the charge pump of FIG. 5.

Referring to FIG. 5, a block diagram of system (or circuit) 100 is shown in accordance with a preferred embodiment of the present invention. The circuit 100 may be implemented to allow tri-stating (e.g., entering a high-Z or high impedance state) of charge pumps within PLL circuits. The tri-stating generally occurs without disturbing the PLL output. The circuit 100 may also be implemented to allow a powering down/up sequence of charge pumps within PLL circuits without disturbing the PLL output. Therefore, the circuit 100 may allow a charge pump to provide tri-state and power down/up sequence without disturbing an output filter circuit.

The circuit 100 generally comprises a logic block (or circuit) 102, a tri-state block (or circuit) 104, a power down block (or circuit) 106 and a charge pump block (or circuit) 108. The logic circuit 102 may have an input 110 that may receive a signal (e.g., EPD), an output 112 that may present a signal (e.g., C1) and an output 114 that may present a signal (e.g., C2). The signal EPD may be implemented as an external power down signal. The signals C1 and C2 may be implemented as control signals. The control signal C1 may be presented to the tri-state circuit 104. The tri-state circuit 104 may have an output 118 that may present a signal (e.g., TRI) to an input 120 of the charge pump circuit 108. The signal C2 may be presented to an input 122 of the power down circuit 106. The power down circuit 106 may have an output 124 that may present a signal (e.g., IPD) to an input 126 of the charge pump 108. The signal TRI may be implemented as a tri-state enable signal. The signal IPD may be implemented as an internal power down signal.

Referring to FIGS. 6*a* and 6*b*, timing diagrams 200 and 200' illustrating operations of the present invention is shown. The timing diagram 200 may illustrate an operation of the tri-state signal TRI and the internal power down signal IPD. The signal TRI generally transitions high (e.g., T1) prior to the signal IPD transitioning high (e.g., T2). The signal TRI generally transitions low (e.g., T4) after the signal IPD transitions low (e.g., T3).

The timing diagram 200' may illustrate the additional signal EPD. At a time (e.g., T1), the signal EPD may have a transition 202 from a LOW state to a HIGH state and the signal TRI may have a transition 204 from a LOW state to a HIGH state. At a time (e.g., T2), the signal IPD may have a transition 206 from a LOW state to a HIGH state. At a time (e.g., T3) the signal EPD may have a transition 208 from a HIGH state to a LOW state and the signal IPD may have a transition 210 from a HIGH state to a LOW state. At a time:(e.g., T4), the signal TRI may have a transition 212 from a HIGH state to a LOW state.

Referring to FIG. 7, a schematic of the charge pump 108 is shown. The charge pump 108 is shown in connection with a phase frequency detector (PFD) 250, a level shifter 252, a level shifter 254 and an inverter 256. The level shifters 252 and 254 may be implemented to generate a number of signals (e.g., UP, PUN, PD and PDN) in response to the PFD 250. The signal PU may be implemented as a positive pump up-signal. The signal UPN may be implemented as a negative pump-up signal. The signal PD may be implemented as a positive pump-down signal. The signal PDN may be implemented as a negative pump-down signal. The internal power down signal IPD may be presented to a bias generator circuit 280. The circuit 280 may generate a number of bias signals (e.g., BIASa–BIASn). The inverter 256 may be configured to receive the tri-state signal TRI and present a negative tri-state signal (e.g., TRI_N). The inverter 256 may be implemented as at the CMOS level.

The charge pump 108 generally comprises a number of devices 260*a*–260*n*, a number of devices 262*a*–262*n*, a number of devices 264*a*–264*n*, a number of devices 266*a*–266*n*, a number of devices 268*a*–268*n*, and a number of devices 270*a*–270*n*. The devices 260*a*–260*n* and 270*a*–270*n* may be configured as bias devices. The devices 262*a*–262*n* and 268*a*–268*n* may be configured as pump-down devices. The devices 264*a*–264*n* and 266*a*–266*n* may be configured as pump-up devices. The devices 260*a*–260*n* may be controlled by the bias signals BIASa–BIASn. The bias signals BIASa–BIASn may be generated to compensate for the various devices 260*a*–260*n* and 270*a*–270*n*.

The devices 260*a* and 260*b* may be coupled in series with the devices 262*a*–262*n*, 264*a*–264*n* and 270*a*–170*n*. The devices 262*a*–262*n* may be coupled in parallel. The devices 264*a*–264*n* may be coupled in parallel. A device 272 may be coupled across the device 262*a*. The circuit 272 may be controlled by the signal TRI_N. A circuit 274 may be coupled in parallel across the device 264*a*. The device 274 may be controlled by the signal TRI. A node (e.g., DUMP NODE–) is shown between the device 262*a* and the device 264*a*. A node (e.g., FILTER–) is shown between the device 262*n* and the device 264*n*. The node DUMP NODE– may be a buffered version of the node FILTER–. While the circuits 272 and 274 are shown steering 10– current to the node DUMP NODE–, other nodes may receive the current to meet the design criteria of a particular implementation.

The devices 260*c* and 260*n* may be coupled in series with the devices 266*a*–266*n*, 268*a*–268*n* and 270*a*–170*n*. The devices 266*a*–266*n* may be coupled in parallel. The devices 268*a*–268*n* may be coupled in parallel. A circuit 276 may be coupled across the device 266*a*. The circuit 276 may be controlled by the signal TRI_N. A circuit 278 may be coupled across the device 268*a*. The circuit 278 may be controlled by the signal TRI. A node (e.g., DUMP NODE+) is shown between the device 266*a* and the device 268*a*. A node (e.g., FILTER+) is shown between the device 266*n* and the device 268*n*. The node DUMP NODE+ may be a buffered version of the node FILTER+. While the circuits 272 and 274 are shown steering current to the node DUMP NODE–, other nodes may receive the current to meet the design criteria of a particular implementation.

The devices of the charge pump 108 may be implemented as transistors. The circuits 272, 274, 276 and 278 may be implemented, in one example, as CMOS devices, bipolar devices, or other appropriate current steering device. In particular, the particular transistor type of the device 272, 274, 276 and 278 may be varied in order to meet the criteria of a particular implementation. Additionally, a particular transistor type of the devices 260*a*–260*n*, 262*a*–262*n*, 264*a*–264*n*, 266*a*–266*n*, 268*a*–268*n* and 270*a*–270*n* may be varied in order to meet the criteria of a particular implementation.

The circuit 100 may allow for localized tri-stating via the transistors 272, 274, 276 and 278 of the pump 108. The pump 108 may provide localized tri-stating by steering the current path from the pump 108. For example, if the devices 272, 274, 276 and 278 are activated, current from the charge pump 108 may be pulled into the nodes DUMP NODE. Therefore, even if the pump 108 is incorrectly activated the current is steered through the CMOS driven devices 272 and 274 or 276 and 278 to the nodes DUMP NODE.

Figure 8:
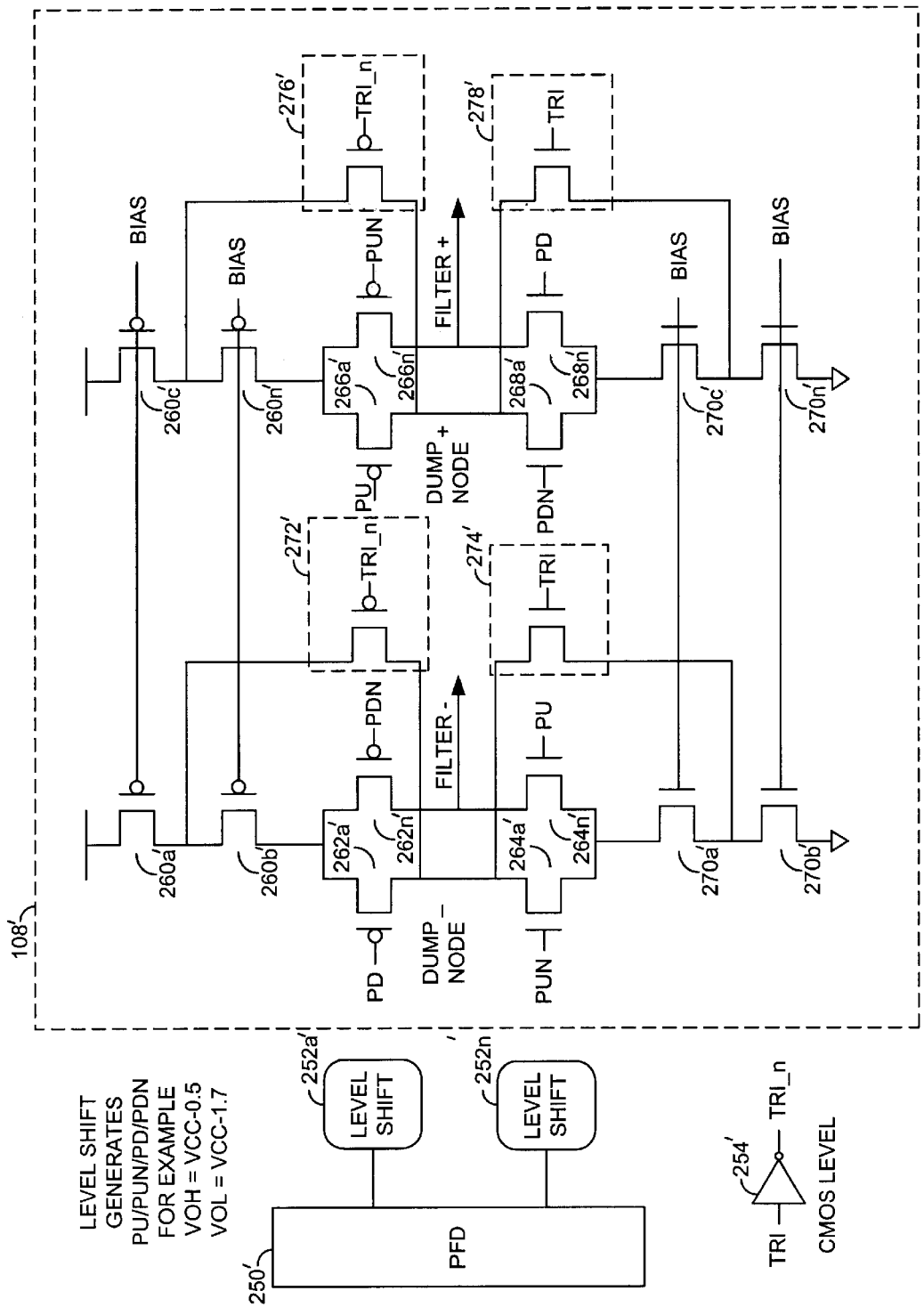
FIG. 8 is a schematic of an alternate embodiment of the charge pump of FIGS. 5 and 7.

Referring to FIG. 8, an alternate embodiment of the charge pump 108 is shown, marked with primed notation. The device 272' may be coupled across the devices 260*b'* and 262*a'*. The device 274' may be coupled across the devices 270*a'* and 264*a'*. The device 276' may be coupled across the devices 260*c'* and 266*a'*. The device 278' may be coupled across the devices 270*c'* and 268*a'*. The devices 272', 274', 276' and 278' may be implemented on the bias lines (e.g., the devices 260a'–260n' and 270a'–270n'). Such a configuration may enhance the circuit 108' by reducing the capacitive load on the common source.

The tri-stated implementation of the charge pump 108 may be implemented as, follows:

(i) prior to powering down the pump 108, the tri-state signal TRI may be activated (for a particular implementation). The activated tri-state signal TRI may insure that the filter nodes FILTER are gated (e.g., disconnected or disabled) from the pump signals PU, PUN, PD and PDN. After a predetermined time, the pump 108 may be powered down via the signal internal power down IPD; and (ii) prior to power up the pump 108, the tri-state signal TRI may be activated (for a particular implementation). The pump 108 may then be powered up. Once the pump 108 is stable, the tri-state signal TRI may be de-activated and the circuit 100 may resume normal operation.

The circuit 100 may allow tri-stating to be localized to the pump 108 and not to other PLL circuits, as in typical implementations. The tri-stating may be accomplished using CMOS level transistors. Such a configuration may eliminate the need for translators to translate input control signals. The charge pump 108 may also have a reduced number of transistors. For example, tri-stating may be accomplished with a minimum number of transistors (e.g., the devices 272, 274, 276 and 278). Furthermore, the circuit 100 may have current savings.

Alternatively, the charge pump 100 may be single ended. The drains of the transistors 262a–262n and 266a–266n may be coupled to Vcc/Vss instead of to the node DUMP NODE. The drains of the transistors 262a–262n and 266a–266n may be coupled to another reference instead of to the node DUMP NODE. The tri-stating transistors 272', 274', 276' and 278' may be staked to replicate the pump 108 (e.g., match VDS).

For conventional charge pumps circuits each gate would use a minimum of 8 or more transistors (e.g., 4 transistors per AND gate or greater than 4 transistors per multiplexer). The transistors of the present invention may be low voltage devices.

The current steering configuration of the charge pump 108 may be faster than conventional architectures. The circuit 100 may implement a simple architecture (e.g., 4 transistor solution). The circuit 100 may implement an improved power down/up condition, by insuring that the control signals PD, PDN, PU and PUN are gated when the pump 108 is not biased. Therefore, no faulty signals may mislead the output of the pump into charging in the wrong direction.

The circuit 100 may use local transistors for current steering at the source of the main differential pair of the charge pump 108. The circuit 100 may use local transistors for current steering at the source of the biasing transistor of the charge pump. The circuit 100 may use local transistors operating at full CMOS levels to tri-state or activate the charge pump 108. The circuit 100 may steer current into the unused node DUMP NODE, therefore allowing drain to source voltage matching. The circuit 100 may use transistors for tri-stating which may also be used as spare transistors in normal operation. The circuit 100 may provide a differential charge pump with tri-state capabilities implemented with minimum transistors (e.g., 4 may be used to tri-state). The circuit 100 may allow a unique sequence of power down events (e.g., enabling the tri-state prior to charge pump power down). The circuit 100 may allow a unique sequence of power up events (e.g., enabling the tri-state prior to charge pump power up). The circuit 100 may be configured to cleanly tri-state the filter 108. Therefore, the circuit 100 may be applicable to a number of applications. For example, the circuit 100 may be used in RF systems, where clean quickly re-lock to multiple frequency channels is needed. Also, in data recovery systems where clean switching from clock to data lock is needed. The circuit 100 may allow tri-stating the filter 108 and once the system is stable, power down (similar for power up).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a phase lock loop (PLL) configured to generate an output signal in response to an input signal; and
   a charge pump within said PLL configured to (i) pump-up said input signal, (ii) pump-down said input signal, (iii) enter a tri-state mode in response to a control signal, or (iv) power up or power down said charge pump in response to a power down signal or a power up signal, wherein said charge pump enters said tri-state mode without disturbing said output signal.

2. The apparatus according to claim 1, wherein said control signal comprises a tri-state signal.

3. The apparatus according to claim 1, wherein said charge pump provides localized tri-stating by steering current away from said charge pump.

4. The apparatus according to claim 2, wherein said charge pump comprises:
   one or more devices configured to pull current from said charge pump to a node in response to said tri-state signal.

5. The apparatus according to claim 4, wherein said devices are further configured to reduce capacitive load on a common source.

6. The apparatus according to claim 1, wherein said charge pump is further configured to (i) disable one or more input filter nodes during a power down or a power up in response to said control signal and (ii) enable said filter nodes after a power up and before a power down in response to said control signal.

7. The apparatus according to claim 1, wherein said charge pump comprises:
   one or more local transistors configured to provide current steering at a source of a main differential pair of transistors of the charge pump.

8. The apparatus according to claim 1, wherein said charge pump further comprises:
   one or more local transistors configured to provide current steering at a source of a biasing transistor of the charge pump.

9. The apparatus according to claim 1, wherein said charge pump comprises:
   a first one or more bias transistors coupled to a first one or more pump-down transistors;
   a first one or more pump-up transistors coupled to a second one or more bias transistors;
   a third,one or more bias transistors coupled to a second one or more pump-down transistors; and a second one or more pump-up transistors coupled to a fourth one or more bias transistors.

10. The apparatus according to claim 9, wherein said charge pump further comprises:

a first tri-state transistor coupled across said first pump-down transistors.

11. The apparatus according to claim 10, wherein said charge pump further comprises:

a second tri-state transistor coupled across said first pump-up transistors.

12. The apparatus according to claim 11, wherein said charge pump further comprises:

a third tri-state transistor coupled across said second pump-down transistors.

13. The apparatus according to claim 12, wherein said charge pump further comprises:

a fourth tri-state transistor coupled across said second pump-up transistors.

14. The apparatus according to claim 13, wherein said first, second, third and fourth tri-state transistors are implemented as CMOS transistors.

15. The apparatus according to claim 13, wherein said first, second, third and fourth tri-state transistors are configured in response to said control signal.

16. The apparatus according to claim 13, wherein:

said first and second tri-state transistors are further coupled across said first pump-down and first pump-up transistors; and said third and fourth tri-state transistors are further coupled across said second pump-down and second pump-up transistors.

17. An apparatus comprising:

means for phase locking an input signal;

means for generating an output signal;

means for pumping-up or pumping-down said input signal, means for powering up or powering down in response to a power up signal or a power down signal; and means for disconnecting said input signal in response to a first state of a control signal and connecting said input signal in response to a second state of said control signal, wherein said disconnecting means does not disturb said output signal.

18. A method for operating a charge pump, comprising the steps of:

(A) disabling one or more filter nodes of said charge pump in response to a control signal;

(B) powering up or powering down said charge pump in response to a power up signal or a power down signal; and (C) enabling or disabling said filter nodes after step (B), wherein said enabling or disabling does not disturb said output signal.

* * * * *